(12) United States Patent
Dadvand et al.

(10) Patent No.: US 10,957,635 B2
(45) Date of Patent: Mar. 23, 2021

(54) MULTI-CHIP PACKAGE WITH HIGH THERMAL CONDUCTIVITY DIE ATTACH

(71) Applicant: Texas Instruments Incorporated, Dallas, TX (US)

(72) Inventors: Nazila Dadvand, Richardson, TX (US); Sreenivasan Koduri, Allen, TX (US); Benjamin Stassen Cook, Addison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 36 days.

(21) Appl. No.: 16/359,628

(22) Filed: Mar. 20, 2019

(65) Prior Publication Data

US 2020/0303285 A1 Sep. 24, 2020

(51) Int. Cl.
*H01L 21/48* (2006.01)
*H01L 21/56* (2006.01)
(Continued)

(52) U.S. Cl.
CPC .......... *H01L 23/49568* (2013.01); *C25D 3/38* (2013.01); *C25D 7/12* (2013.01); *H01L 21/4821* (2013.01); *H01L 21/565* (2013.01); *H01L 21/568* (2013.01); *H01L 23/13* (2013.01); *H01L 23/142* (2013.01); *H01L 23/3121* (2013.01); *H01L 23/49503* (2013.01); *H01L 23/49541* (2013.01); *H01L 23/49575* (2013.01); *H01L 24/29* (2013.01); *H01L 24/32* (2013.01); *H01L 24/48* (2013.01); *H01L 24/73* (2013.01); *H01L 24/85* (2013.01); *H01L 24/92* (2013.01); *H01L 25/0655* (2013.01); *H01L 25/18* (2013.01); *H01L 23/544* (2013.01); *H01L 24/49* (2013.01); *H01L 2223/54426* (2013.01);
(Continued)

(58) Field of Classification Search
None
See application file for complete search history.

(56) References Cited

U.S. PATENT DOCUMENTS

| 6,277,672 B1 | 8/2001 | Ho |
| 2004/0063249 A1 | 4/2004 | Lin et al. |

(Continued)

FOREIGN PATENT DOCUMENTS

KR 20130015484 2/2013

*Primary Examiner* — Kenneth Parker
*Assistant Examiner* — Long H Le
(74) *Attorney, Agent, or Firm* — Ronald O. Neerings; Charles A. Brill; Frank D. Cimino (57) ABSTRACT

A packaged semiconductor device includes a metal substrate having a first and second through-hole aperture having an outer ring, and metal pads around the apertures on dielectric pads. A first and second semiconductor die have a back side metal (BSM) layer on its bottom side are mounted top side up on a top portion of the apertures. A metal die attach layer is directly between the BSM layer and walls of the metal substrate bounding the apertures to provide a die attachment for the first and the second semiconductor die that fills a bottom portion of the apertures. Leads contact the metal pads, wherein the leads include a distal portion that extends beyond the metal substrate. Bondwires are between the metal pads and bond pads on the first and second semiconductor die, and a mold compound provides encapsulation for the packaged semiconductor device.

19 Claims, 5 Drawing Sheets

(51) Int. Cl.
  *H01L 25/18* (2006.01)
  *H01L 25/065* (2006.01)
  *C25D 7/12* (2006.01)
  *C25D 3/38* (2006.01)
  *H01L 23/00* (2006.01)
  *H01L 23/13* (2006.01)
  *H01L 23/14* (2006.01)
  *H01L 23/31* (2006.01)
  *H01L 23/367* (2006.01)
  *H01L 23/495* (2006.01)
  *H01L 23/498* (2006.01)
  *H01L 23/544* (2006.01)

(52) U.S. Cl.
  CPC ............... *H01L 2224/27462* (2013.01); *H01L 2224/29147* (2013.01); *H01L 2224/32245* (2013.01); *H01L 2224/48091* (2013.01); *H01L 2224/48101* (2013.01); *H01L 2224/48106* (2013.01); *H01L 2224/48137* (2013.01); *H01L 2224/48247* (2013.01); *H01L 2224/49176* (2013.01); *H01L 2224/73265* (2013.01); *H01L 2224/92247* (2013.01); *H01L 2924/2064* (2013.01); *H01L 2924/20641* (2013.01); *H01L 2924/20642* (2013.01)

(56) References Cited

U.S. PATENT DOCUMENTS

| | | |
|---|---|---|
| 2009/0102028 A1* | 4/2009 | Krishnan ............... H01L 24/83 257/666 |
| 2011/0227233 A1 | 9/2011 | Wainerdi et al. |
| 2012/0199960 A1 | 9/2012 | Cosue et al. |
| 2013/0313726 A1 | 11/2013 | Uehling |
| 2017/0178998 A1 | 6/2017 | Jeun et al. |
| 2019/0311965 A1* | 10/2019 | Yanagida ............ H01L 21/4853 |

\* cited by examiner

MULTI-CHIP PACKAGE WITH HIGH THERMAL CONDUCTIVITY DIE ATTACH

CROSS-REFERENCE TO COPENDING APPLICATIONS

This application has subject matter related to copending application Ser. No. 16/026,371 entitled "SEMICONDUCTOR DEVICE WITH ELECTROPLATED DIE ATTACH" that was filed on Jul. 3, 2018.

FIELD

This Disclosure relates to semiconductor device assembly, more specifically to metal die attachment to a substrate.

BACKGROUND

Packaged semiconductor devices generally comprise an integrated circuit (IC) die which is conventionally a silicon die that is mounted on a die pad of a workpiece such as a lead frame using a die attach adhesive. Other workpieces include an interposer, printed circuit board (PCB), and another IC die. For IC die assembled top (active) side up and back side down, the die attach adhesive provides a mechanical attachment, and generally also provides an electrical and/or thermal pathway to the die pad. The die attach adhesive generally comprises a polymer such as a polyimide or an epoxy-based adhesive. Silver is often added in particle flake form as a filler to raise both the electrical conductivity and the thermal conductivity of the polymer material.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize conventional die attach solutions comprising metal particle filled polymers have significant thermal and electrical resistance. Since thermal management is becoming more important with the trend for more compact and more highly integrated electronic systems having smaller features and running at higher operating currents, higher thermal conductivity die attach arrangements are needed that also provide a low electrical resistance when back side electrical contact to the semiconductor die is used. It is recognized that although solder die attach, such as eutectic gold and tin (AuSn), can provide back side electrical contact to the semiconductor die with relatively good thermal and electrical resistance performance as compared to metal particle filled polymers, solder die attach is relatively expensive, and is limited to solderable die surfaces. Moreover, the solder die attach process involves an inert reflow process at temperatures that can cause temperature induced stresses to the semiconductor die's metal interconnect.

Disclosed aspects include a packaged semiconductor device including a metal substrate having a first and second through-hole aperture each having an outer ring, and metal pads around the apertures on dielectric pads on the metal substrate. A first and second semiconductor die having a BSM layer on its bottom side are mounted top side up on a top portion of the apertures. A metal die attach layer is between the BSM layer and walls of the metal substrate bounding the apertures to provide a die attachment for the first and the second semiconductor die that fills a bottom portion of the apertures. Leads contact the metal pads, wherein the leads include a distal portion that extends beyond the metal substrate. Bondwires are between the metal pads and bond pads on the first and second semiconductor die, and a mold compound generally provides device encapsulation for the packaged semiconductor device.

BRIEF DESCRIPTION OF THE DRAWINGS

Reference will now be made to the accompanying drawings, which are not necessarily drawn to scale, wherein.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Disclosed aspects include a multi-chip semiconductor package where the die attachment for the first and at least a second semiconductor die is established through a plated metal layer such as comprising copper, Ni, Co, or alloys thereof, as opposed to conventional solder. Therefore, voiding issues for solder die attached processes related to Sn—Cu intermetallic formation are eliminated in disclosed multi-chip packages.

Figure 1A:
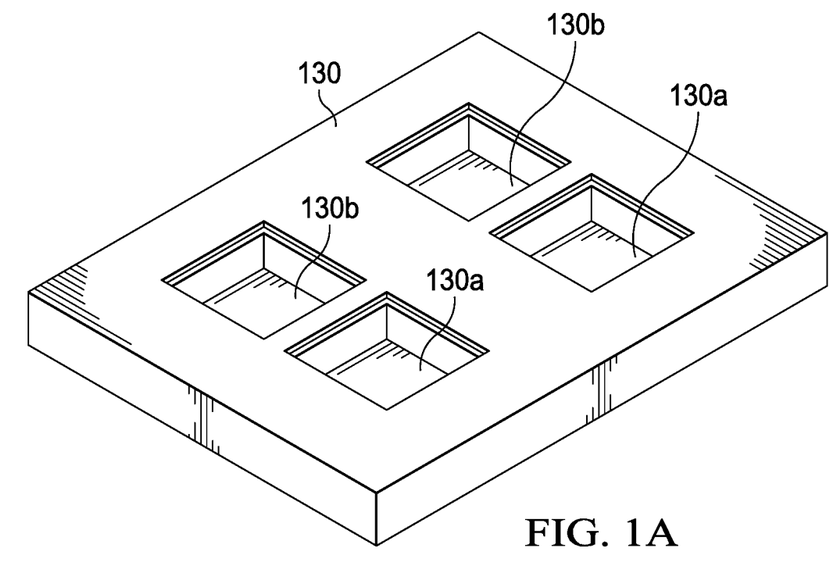
FIGS. 1A-F show components utilized and assembly process progression process for an assembly process for forming a disclosed multi-chip packaged semiconductor device having a first and a second semiconductor die on a metal substrate having raised metal pads comprising metal pads on dielectric pads on the surface of a metal substrate, where each semiconductor die having a BSM layer is directly attached onto the metal substrate by a disclosed electroplated (plated) metal die attach layer, according to an example aspect.

FIG. 1A shows an example dielectric cover 130 for covering a metal substrate (see the metal substrate 120 in FIG. 1B) for forming a covered substrate stack, where the dielectric cover 130 has a repeating pattern each including a recess pair 130a, 130b comprising a first recess 130a and a second recess 130b. The covered substrate stack is configured for immersing in a plating container described below relative to FIG. 1E shown as 150 that provides an electroplating bath.

The dielectric cover 130 can comprise a plastic. The first recess 130a is for covering a first semiconductor die and the second recess 130b is for covering a second semiconductor die, that are both shown for example as being rectangular shaped and sized to match the dimensions of the respective semiconductor die to be covered. The recesses 130a, 130b are slightly larger in area as compared to the first and second semiconductor die to enable receiving the respective semiconductor die. Although shown as the same size and shape, the first and the second recesses 130a and 130b can be sized and shaped differently relative to one another to match the respective dimensions of the first and second semiconductor die.

Alternatively, a UV curable electroplating solution resistant tape can be used as the dielectric cover 130. In the case of a tape instead of the dielectric cover, there will be no need for recesses. A dielectric cover on the top side of the first and second semiconductor die prevents the die from falling off when inside the plating solution.

Figure 1B:
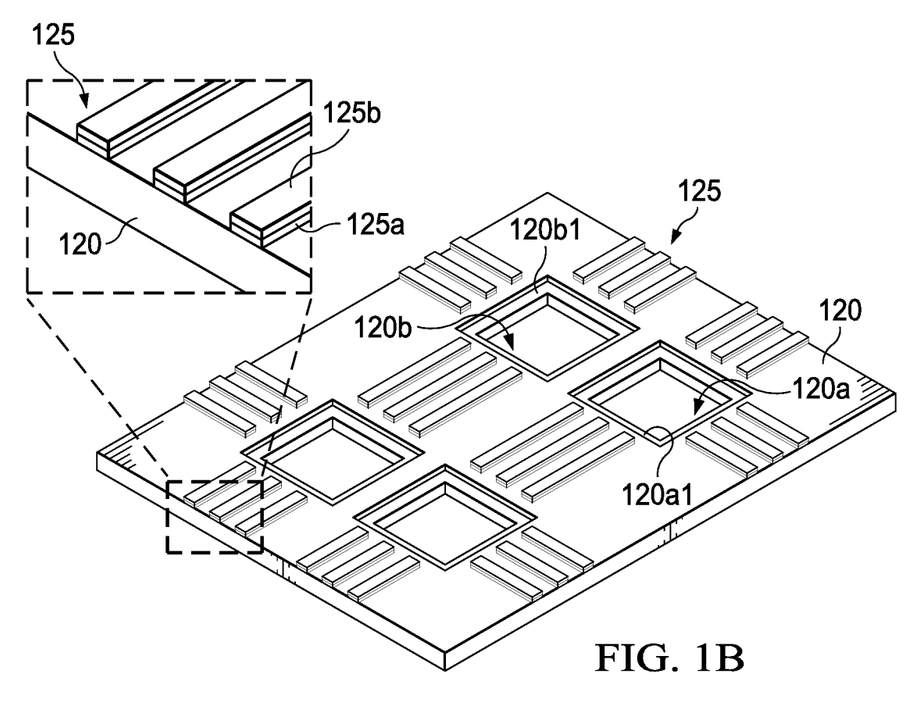

FIG. 1B shows an example metal substrate 120 with an inset expanding a portion thereof to show respective components of the raised pads 125 each comprising a metal pad 125b on a dielectric pad 125a (e.g., a polyimide) on the surface of the metal substrate 120. The metal substrate 120 is generally in the form of a substrate sheet/panel having a plurality of dual-die position through-hole apertures comprising a first aperture 120a, and a second aperture 120b configured for a first and a second semiconductor die 180a, 180b shown in FIG. 1C to be positioned top side up within the apertures 120a, 120b. The metal substrate sheet/panel may have about 50 to 1,000 dual-die positions. The metal substrate 120 is generally about 0.1 mm (3.94 mils) to 0.3 mm (11.81 mils) thick.

The metal substrate 120 can comprise copper, such as a copper alloy. Other example metals for the metal substrate 120 can also include Ni, Co, Sn, or their alloys. The first and second apertures 120a, 120b are in a repeating pattern having positions matching the size(s) and repeating pattern of the recess pairs 130a, 130b of the dielectric cover 130 shown in FIG. 1A. The apertures 120a and 120b each have an outer ring 120a1 and 120b1 for the first and second semiconductor die to sit on, where the raised pads 125 are on sides generally around the through-hole apertures 120a and 120b. The metal pads 125b may be printed on the dielectric pads 125a. The printing is generally registered by alignment marks on the metal substrate 120.

Figure 1C:
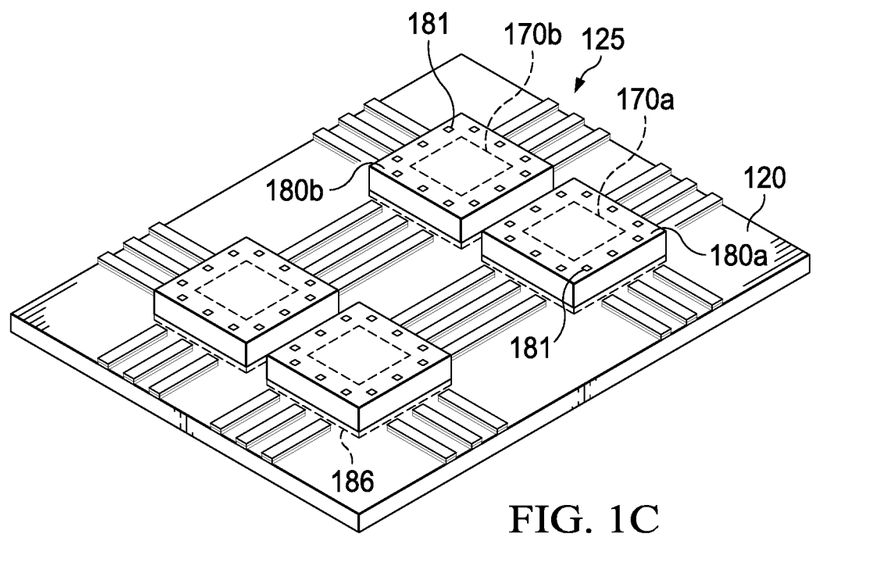

FIG. 1C shows a first and a second semiconductor die 180a and 180b sitting top (active) side up with their back side down on the outer rings 120a1 and 120b1 (shown in FIG. 1B) within the apertures 120a and 120b of the metal substrate 120. Bond pads 181 that are coupled to nodes in the circuitry 170a, 170b are shown on the active top side of the semiconductor die 180a and 180b. The circuitry 170a, 170b comprises circuit elements (including transistors, and generally diodes, resistors, capacitors, etc.) formed in a semiconductor layer (an epitaxial layer on a bulk substrate) configured together for generally realizing at least circuit function. Example circuit functions include analog (e.g., amplifier or power converter), radio frequency (RF), digital, or non-volatile memory functions.

The first and second semiconductor die 180a and 180b have a BSM layer 186, such as comprising copper. Although not shown, there can be an optional refractory metal barrier layer (e.g., TiW TaN, or Cr) underneath the BSM layer 186. The bond pads 181 can include Cu pillars or solder bumps thereon.

Figure 1D:
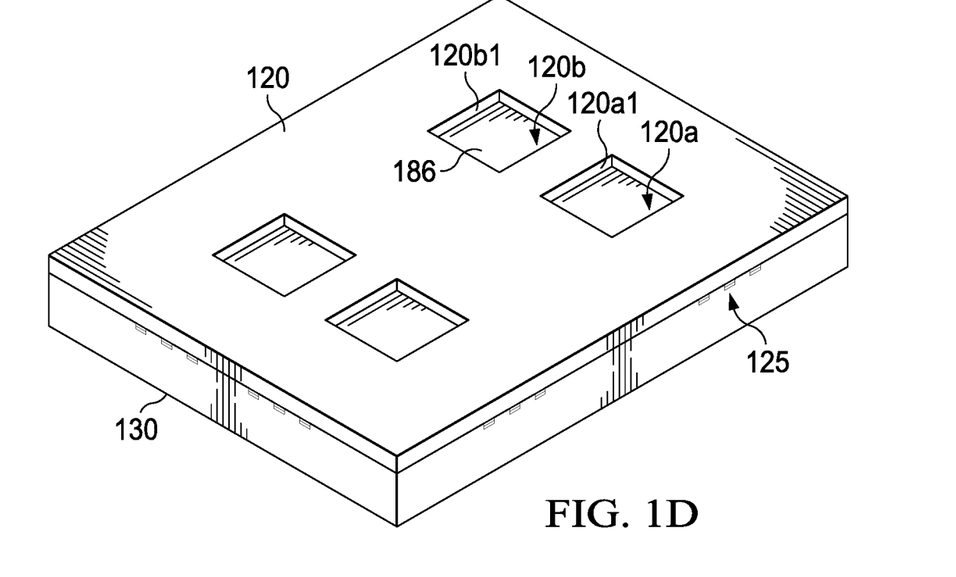
Figure 1E:
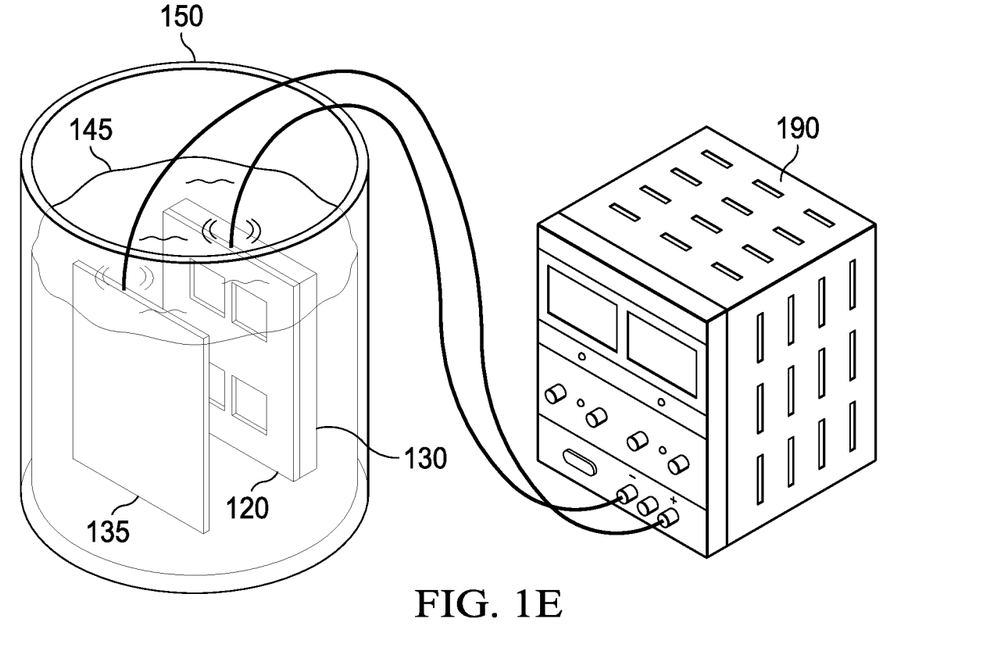

FIG. 1D shows the dielectric cover 130 after being placing on the metal substrate 120 over the semiconductor die 180a, 180b with the view inverted to look down at the bottom of the metal substrate 120 that reveals the portion of the apertures 120a and 120b not occupied by the semiconductor die 180a, 180b. The BSM layer 186 is shown on the back side of the semiconductor die 180a, 180b.

FIG. 1E shows immersing a disclosed covered substrate stack comprising a dielectric cover 130 on a metal substrate 120 having first and second semiconductor die (not shown) therein within a plating container 150 that provides an electroplating bath. These components are immersed in a plating solution 145 including an electrolyte containing one or more dissolved metal salts including the metal of interest to electroplate, as well as other ions in the solution that permit the flow of electricity.

In the case of a dielectric cover there is also generally a sealant, such as electroplating solution resistant tape between the dielectric cover 130 and the metal substrate 120 to avoid plating the plated metal die attach layer on the top side of the semiconductor die 180a, 180b. For electroplating, the metal substrate 120 is connected to a negative terminal (cathode) of a power supply 190, and an electrically conductive structure spaced aperture from the metal substrate 120 such as a metal block shown as an anode 135 spaced apart from the metal substrate 120 is connected to a positive terminal (anode) of the power supply 190.

The electroplating is generally performed at a temperature from 15° C. to 30° C. to avoid introduction of temperature induced stresses, such as to the interconnect on the semiconductor die. At the cathode, the dissolved metal ions (e.g., $Cu^{+2}$) in the plating solution 145 are reduced at the interface between the solution and the cathode, such that they plate out to a zero valence state metal (e.g., Cu metal) onto the cathode. The electroplating is generally performed using direct current (DC), but can also be performed as pulsed electroplating.

Figure 1F:
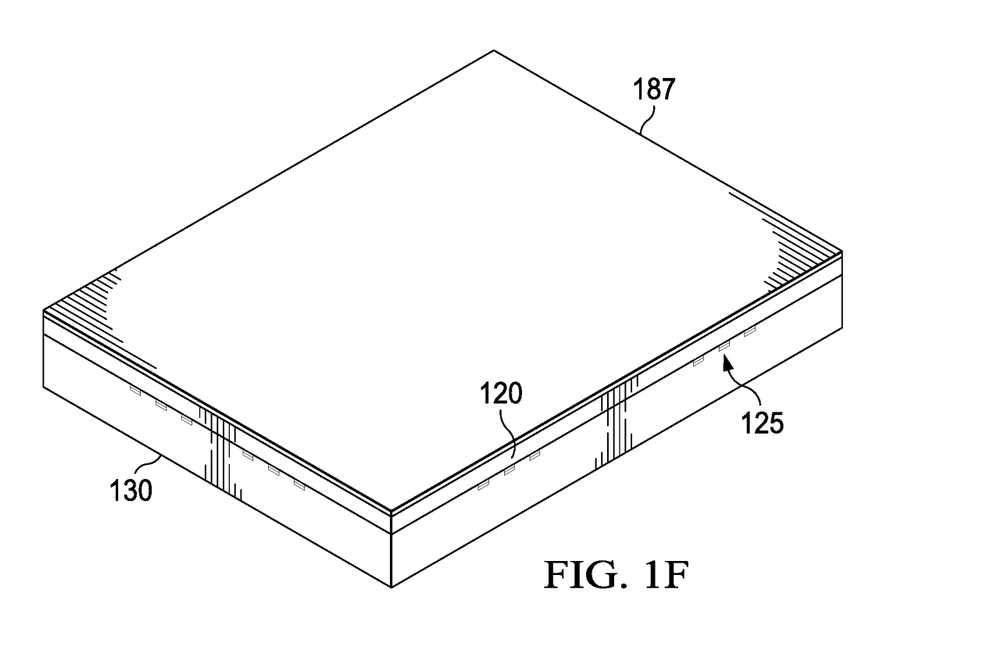

The electroplating deposits a plated metal die attach layer shown herein as 187 including in FIG. 1F, as a single layer, such as comprising copper, to fill a volume between the BSM layer 186 on the bottom side of the semiconductor die 180a and 180b and the walls of the metal substrate 120 bounding the apertures 120a, 120b to provide a die attachment. The time for the electroplating process can be calculated by dividing the desired metal die attach layer 187 thickness by the deposition rate. The plated metal die attach layer 187 thickness is designed to fill the apertures 120a, 120b, such as being 10 to 250 µm thick, for example being 40 to 250 µm thick.

FIG. IF shows the portion of the apertures 120a, 120b not occupied by the semiconductor die 180 (under the die) now filled with a plated metal die attach layer 187 that is deposited as a sheet on the entire bottom side of the metal substrate 120. Although the plated metal die attach layer 187 is shown being planar, there is generally a slight depression when over the respective apertures 120a, 120b.

The plated metal die attach layer 187 being a plated metal layer is a distinctive layer even as compared to other layers of the same metal material deposited by other methods, such as sputtered metal layers. Electrodeposited layers are known to fill regions that are not line of sight, unlike sputtered layers. Electrodeposited layers are also known to have a unique microstructure that includes an initially deposited Nernst diffusion layer that has a density and microstructure distinct from that of the bulk portion of the electrodeposited layer.

Figure 2A:
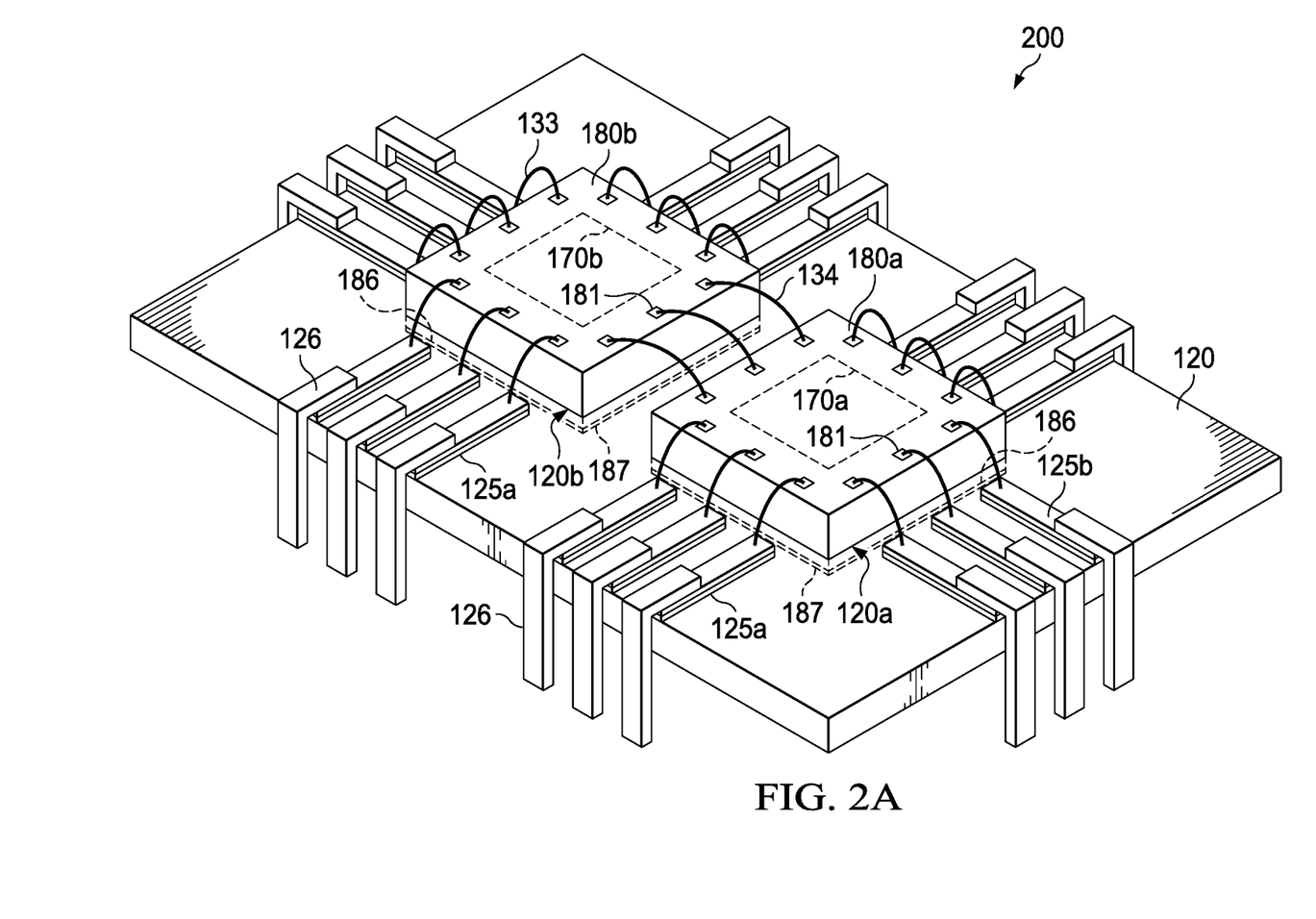
FIG. 2A shows an example leaded multi-chip semiconductor device having a first and a second semiconductor die on a metal substrate after singulation then wirebonding bond pads on the respective semiconductor die to raised metal pads that are connected to leads, and bond pads between the respective semiconductor die.

FIG. 2A shows a single leaded multi-chip semiconductor device 200 after removing the covered substrate stack from the plating solution 145, removing the dielectric cover 130, singulating the metal substrate 120 and adding leads 126 onto the metal pads 125b of the raised pads 125, such as by soldering. The leaded multi-chip semiconductor device 200 can be seen to be an 18 lead package. The leads 126 comprise strips of metal (e.g., the same metal as for lead frames) such as being copper, copper alloy or tin coated leads 126 that can be acquired commercially or generated in-house. For example, a metal sheet can be cut into strips of metal for the leads 126.

Figure 2B:
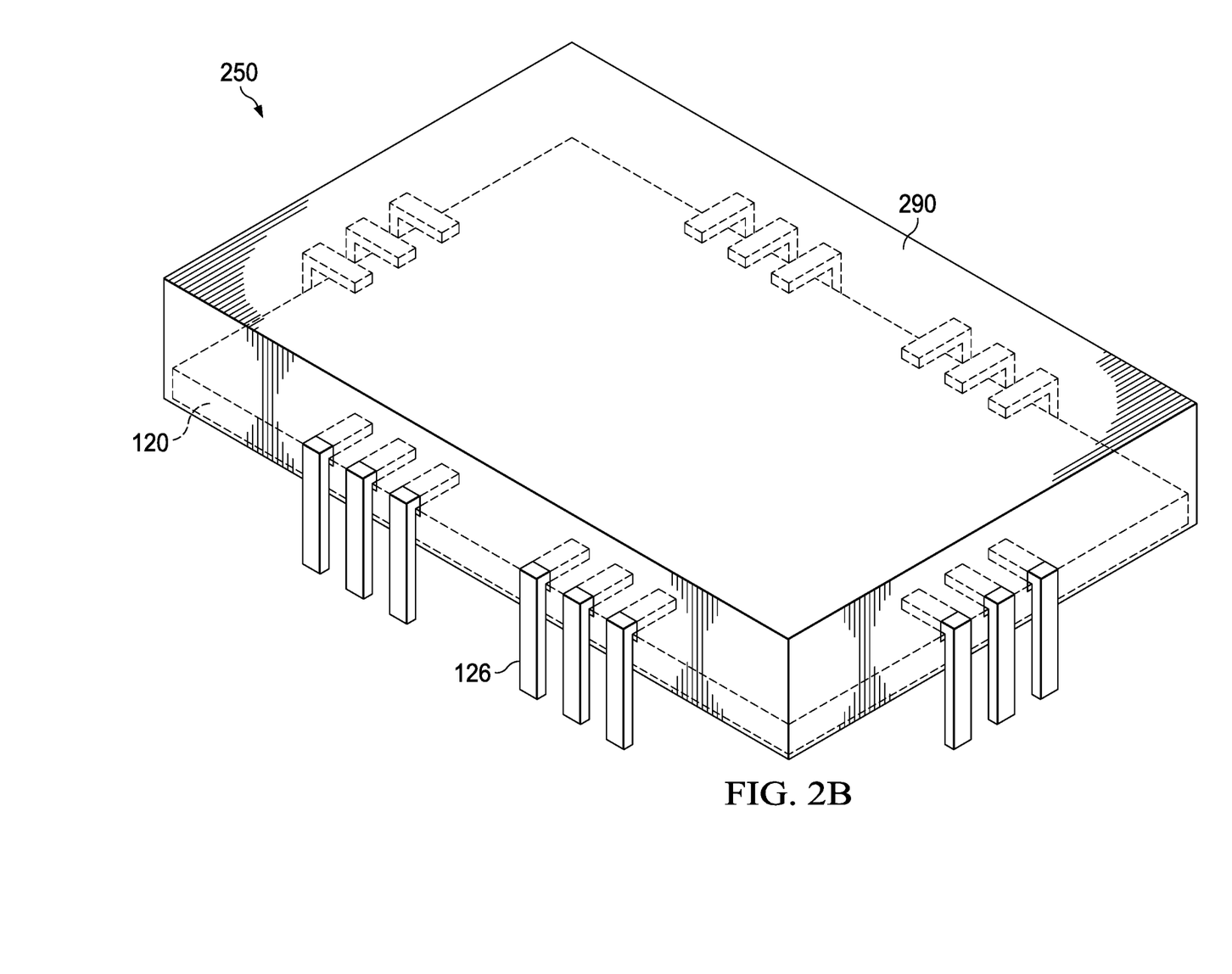
FIG. 2B shows the leaded multi-chip packaged semiconductor device shown in FIG. 2A after molding to form a mold compound to provide a molded leaded multi-chip packaged semiconductor device.

The leads 126 have at least one bend and include a distal portion that extends beyond the metal substrate 120. Although not shown, the leads 126 can be in a gull wing arrangement. The leads 126 are generally soldered to the metal pads 125*b* but can also be attached via welding or by an electrically conductive adhesive material. The bondwires 133 and 134 shown are added before singulation, including bondwires 133 connecting between the metal pads 125*b* of the raised pads 125 and the bond pads 181 on the semiconductor die 180*a*, 180*b*. There are also optional bondwires 134 shown connecting between bond pads 181 on the respective semiconductor die 180*a*, 180*b*. FIG. 2B shows the disclosed leaded multi-chip packaged semiconductor device now shown as 250 after forming a mold compound 290 that provides encapsulation for the packaged semiconductor device.

Disclosed aspects can be integrated into a variety of assembly flows to form a variety of different multi-chip semiconductor packaged devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A packaged semiconductor device, comprising:
a metal substrate having a first through-hole aperture and a second through-hole aperture each having an outer ring, and a plurality of metal pads around the first and the second through-hole apertures on dielectric pads;
a first and a second semiconductor die that each have a back side metal (BSM) layer on its bottom side mounted top side up on a top portion of the apertures;
a metal die attach layer directly between the BSM layer and walls of the metal substrate bounding the apertures to provide a die attachment for the first and the second semiconductor die that fills a bottom portion of the apertures;
leads that contact the plurality of metal pads, wherein the leads include a distal portion that extends beyond the metal substrate;
bondwires between the plurality of metal pads and bond pads on the first and the second semiconductor die, and
a mold compound providing encapsulation.

2. The packaged semiconductor device of claim 1, wherein the dielectric pads comprise a polymer.

3. The packaged semiconductor device of claim 1, wherein the metal die attach layer consists of a single layer.

4. The packaged semiconductor device of claim 1, wherein the BSM layer, the metal substrate, and the metal die attach layer all comprise copper.

5. The packaged semiconductor device of claim 1, wherein the metal die attach layer is an electroplated metal layer.

6. The packaged semiconductor device of claim 1, further comprising other bondwires between other bond pads on the first semiconductor die and other bond pads on the second semiconductor die.

7. The packaged semiconductor device of claim 1, wherein the metal die attach layer is 40 to 250 µm thick.

8. The packaged semiconductor device of claim 1, wherein the metal substrate is 0.1 mm to 0.3 mm thick.

9. A packaged semiconductor device, comprising:
a metal substrate having a first through-hole aperture and a second through-hole aperture each having an outer ring, and a plurality of metal pads around the first and the second apertures on a dielectric pads;
a first and a second semiconductor die that each have a back side metal (BSM) layer on its bottom side mounted top side up on a top portion of the apertures;
a metal die attach layer directly between the BSM layer and walls of the metal substrate bounding the apertures to provide a die attachment for the first and the second semiconductor die that fills a bottom portion of the apertures;
leads that contact the plurality of metal pads, wherein the leads include a distal portion that extends beyond the metal substrate;
bondwires between the plurality of metal pads and bond pads on the first and the second semiconductor die, and
a mold compound providing encapsulation,
wherein the metal die attach layer consists of a single layer, and
wherein the BSM layer, the metal substrate, and the metal die attach layer all comprise copper.

10. The packaged semiconductor device of claim 9 further comprising other bondwires between other bond pads on the first semiconductor die and on the second semiconductor die.

11. The packaged semiconductor device of claim 9, wherein the metal die attach layer is 40 to 250 µm thick.

12. A packaged semiconductor device, comprising:
a metal substrate including a repeating pattern of a first through-hole aperture and a second through-hole aperture each having an outer ring, and a plurality of metal pads around the apertures on dielectric pads, the outer rings position matching a first and a second semiconductor die that each have a back side metal (BSM) layer thereon;
the first semiconductor die and the second semiconductor die each having bond pads top side up inserted into respective ones of the plurality of apertures;
a top side of the first semiconductor die and the second semiconductor die securing the first and the second semiconductor die in the apertures; and
an electroplated metal die attach layer filling a volume between the BSM layer and walls of the metal substrate bounding the apertures.

13. The packaged semiconductor device of claim 12, wherein the dielectric pads comprise a polymer.

14. The packaged semiconductor device of claim 13, wherein the metal die attach layer consists of a single layer.

15. The packaged semiconductor device of claim 13, wherein the BSM layer, the metal substrate, and the metal die attach layer all comprise copper.

16. The packaged semiconductor device of claim 13, wherein the metal die attach layer is an electroplated metal layer.

17. The packaged semiconductor device of claim 13, further comprising other bondwires between other bond pads on the first semiconductor die and other bond pads on the second semiconductor die.

18. The packaged semiconductor device of claim 13, wherein the metal die attach layer is 40 to 250 μm thick.

19. The packaged semiconductor device of claim 13, wherein the metal substrate is 0.1 mm to 0.3 mm thick.

* * * * *